(12) United States Patent
Sato et al.

(10) Patent No.: US 8,491,326 B2
(45) Date of Patent: Jul. 23, 2013

(54) ELECTRICAL CONNECTION BOX

(75) Inventors: Hisashi Sato, Kakegawa (JP); Masaki Yamamoto, Kakegawa (JP); Kazuaki Nakamura, Kakegawa (JP); Masayuki Hagiwara, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 13/217,573

(22) Filed: Aug. 25, 2011

(65) Prior Publication Data

US 2012/0052748 A1    Mar. 1, 2012

(30) Foreign Application Priority Data

Aug. 27, 2010   (JP) .................................. 2010-190794

(51) Int. Cl.
*H01R 4/2433*   (2006.01)
(52) U.S. Cl.
USPC ........................................................ 439/404
(58) Field of Classification Search
USPC ................. 439/404, 402, 403, 397, 748, 885, 439/701, 540.1
See application file for complete search history.

(56) References Cited

U.S. PATENT DOCUMENTS

| 6,022,247 A * | 2/2000 | Akiyama et al. .............. 439/701 |
| 6,196,882 B1 * | 3/2001 | Sato et al. ..................... 439/701 |
| 6,811,412 B2 * | 11/2004 | Uezono ........................ 439/76.2 |

FOREIGN PATENT DOCUMENTS

JP    2006-345616 A    12/2006

* cited by examiner

*Primary Examiner* — Tulsidas C Patel
*Assistant Examiner* — Phuongchi T Nguyen
(74) *Attorney, Agent, or Firm* — Edwards Wildman Palmer LLP

(57) ABSTRACT

There is provided a downsized electrical connection box in which the reliability of the mechanical connection between blocks provided in the electrical connection box is improved. The electrical connection box 1 includes a plurality of electric components, a first block 3 mounted with the electric components and a second block mounted with the electric components. The first block 3 includes a tubular-shaped first member 32, 33 projecting towards the second block 5. The second block 5 includes a second member 52, 53 arranged to be slidably inserted into the first member. The first and the second blocks 3, 5 are coupled to each other by slidably inserting the second member 52, 53 into the first member 32, 33. At least one electric component 8 of the plurality of electric components is received inside the first and the second members 32, 52, 33, 53.

6 Claims, 4 Drawing Sheets

ELECTRICAL CONNECTION BOX

CROSS REFERENCE TO RELATED APPLICATION

The priority application Japanese Patent Application No. 2010-190794 upon which this patent application is based is hereby incorporated by reference.

BACKGROUND OF THE INVENTION

1. Field of the Invention

The present invention relates generally to an electrical connection box to be mounted to an engine room of a motor vehicle.

2. Description of the Related Art

Various electric equipments are mounted to a motor vehicle as a moving body. In order to supply electric power to those electric equipments, an electrical connection box is mounted at suitable places in the vehicle between a power source and the electric equipments. Such electrical connection box is mounted with electric components such as a connector, a relay and a fuse.

The term an electrical connection box used herein is also referred to as a junction block, a fuse block or a relay box.

FIG. 6 is a perspective view of a conventional electrical connection box 101. FIG. 7 is a cross-sectional view of the conventional electrical connection box 101 taken along a line shown in FIG. 6. The conventional electrical connection box 101 includes a first cassette block 103, a second cassette block 105, a plurality of electric components (not shown) mounted to the respective cassette blocks 103, 105 such as a relay, a fusible link and a fuse, a plurality of bus bars 108, 109 as a connection member connected to the respective electric components, a connection structure 110 having a mechanical connection structure 110A connecting the cassette blocks 103, 105 to each other and an electrical connection structure 110B connecting the bus bars 108, 109 to each other, and a housing 102 receiving the cassette blocks 103, 105 connected to each other as well as the bus bars 108, 109 connected to each other.

The respective cassette blocks 103, 105 are formed into a block-like shape. As shown in FIG. 7, each of the cassette blocks 103, 105 is mounted with the plurality of electric components connected with the bus bars 108, 109.

The mechanical connection structure 110A includes an insert portion 104 provided to the first cassette block 103 and a receiving portion 106 provided to the second cassette block 105 and arranged to receive the insert portion 104.

The electrical connection structure 110B includes a male terminal 111 provided to the bus bar 109 and a female terminal 112 provided at the bus bar 108. The female terminal 112 includes a slit portion 108a for receiving the male terminal 111 (thus a front view of the female terminal 112 is in a turning-folk-like shape).

For the electrical connection box 101, when the cassette blocks 103, 105 are moved towards each other along an insertion direction Z, the insert portion 104 is inserted into the receiving portion 106 so that the cassette blocks 103, 105 are attached (mechanically connected) to each other. At the same time, the male terminal 111 is inserted into the slit portion 108a of the female terminal 112 so that the bus bar 108 attached to the first cassette block 103 and the bus bar 109 attached to the second cassette block 105 are electrically connected to each other (refer for example to Japanese Patent Application Publication No. 2006-345616).

However, there is a problem in the above-described conventional electrical connection box 101. That is, the conventional electrical connection box 101 requires the connection structure 110 having the mechanical connection structure 110A for connecting the cassette blocks 103, 105 to each other and the electrical connection structure 110B for connecting the bus bars 108, 109 to each other. Thus, the size of the conventional electrical connection box 101 (the housing 102) is increased to receive the connection structure 110.

There is another problem in the conventional electrical connection box 101. That is, the cassette blocks 103, 105 are attached to each other by inserting the insert portion 104 of the first cassette block 103 into the receiving portion 106 of the second cassette block 105. Also, the bus bars 108, 109 are connected to each other by inserting the male terminal 111 into the slit portion 108a of the female terminal 112. Thus, for example the vibratory motion of the moving vehicle may cause the cassette blocks 103, 105 to move away from each other along the insertion direction Z, causing the insert portion 104 to be separated from the receiving portion 106. As a result, the cassette blocks 103, 105 may be separated from each other as well as the bus bars 108, 109, thereby breaking the electrical connection between the bus bars 108, 109.

SUMMARY OF THE INVENTION

In view of the above-described problem, an object of the present invention is to provide a downsized electrical connection box having improved mechanical connection reliability between the cassette blocks of the electrical connection box.

In order to achieve the above-mentioned object, the present invention provides an electrical connection box having a plurality of electric components, a first block mounted with the electric components and a second block coupled to the first block and mounted with the electric components, the electrical connection box including a tubular-shaped first member provided to the first block and projecting towards the second block and a second member provided to the second block and arranged to be slidably inserted into the first member. The first block and the second block are coupled to each other by slidably inserting the second member into the first member. Furthermore, at least one electric component of the plurality of electric components is received inside the first member and the second member attached to each other.

According to the present invention described above, the first and the second blocks can be coupled to each other without requiring the above-described mechanical connection structure of the conventional electrical connection box, thereby downsizing the electrical connection box. Also, according to the present invention, the number of electric components mounted to the first and the second blocks can be increased.

Furthermore, a first connection member connected to the electrical components mounted to the first block and a second connection member connected to the electrical components mounted to the second block are electrically connected to each other via the at least one electric component of the plurality of electric components received inside the first member and the second member attached to each other.

According to the present invention described above, the first and the second electric wires can be connected to each other without requiring the above-described electrical connection structure of the conventional electrical connection box, thereby further downsizing the electrical connection box.

Furthermore, the first member is provided with an arm portion and a first engagement portion projecting from the arm portion towards the second member, the aim portion being arranged between a pair of slits formed at the first member along a direction of insertion of the second member. Furthermore, the second member is provided with a second engagement portion arranged to engage with the first engagement portion.

According to the present invention described above, the first and the second blocks are firmly engaged with each other and are prevented from being separated from each other due to the vibratory movement of the moving vehicle. Thus, the reliability of the mechanical connection between the first and the second cassette blocks can be improved.

DETAILED DESCRIPTION OF THE INVENTION

Figure 1:
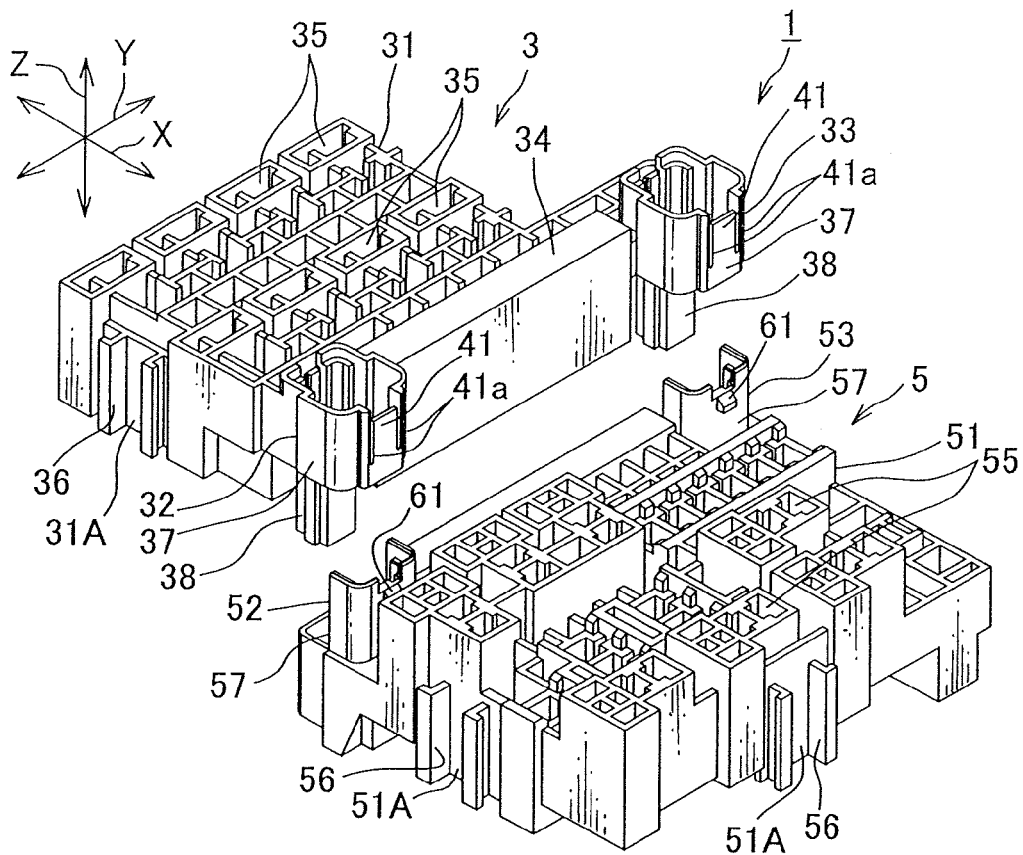
FIG. 1 is a perspective view of a first cassette block and a second cassette block included in an electrical connection box according to one embodiment of the present invention.

An electrical connection box according to one embodiment of the present invention is described below with reference to FIGS. 1 through 5.

An electrical connection box 1 according to the present invention is arranged to be mounted to an engine room of a motor vehicle to supply electrical power to various electric equipments mounted to the motor vehicle. The term electrical connection box used herein is broadly interpreted as a junction box, a fuse block or a relay box.

As shown in FIGS. 1 through 5, the electrical connection box 1 includes a plurality of electric components, a first cassette block 3 having a pair of first receiving portions 32, 33, a second cassette block 5 coupled to the first cassette block 3 and having a pair of second receiving portions 52, 53, a plurality of first electric wires wired at the first cassette block 3, a plurality of second electric wires wired at the second cassette block 5, a fuse 8 connected to the first and the second electric wires, and a housing (not shown) arranged to receive the first and the second cassette blocks 3, 5. The second receiving portions 52, 53 are arranged to be slidably inserted into the first receiving portions 32, 33, respectively. The fuse 8, the first electric wires and the second electric wires described above correspond to "at least one electric component of the plurality of electric components", "a first connection member" and "a second connection member" described in the claims, respectively.

In the drawings, a Y direction corresponds to a direction of an alignment of is the pair of first receiving portions 32, 33 of the first cassette block 3 (the pair of second receiving portions 52, 53 of the second cassette block 5) as well as to a widthwise direction of the housing. Also, a X direction corresponds to a lengthwise direction of the housing, and a Z direction is parallel to a height of the housing and corresponds to a direction of insertion of the second receiving portions 52, 53 into the first receiving portions 32, 33. In the description, the terms of an upper side and a lower side are used in relation to the Z direction.

The first cassette block 3 is made of synthetic resin and is integrally formed with a block-shaped first main body 31, the pair of first receiving portions 32, 33 provided to the first main body 31 and an overlapping portion 34 arranged between the pair of first receiving portions 32, 33. The first receiving portion 32, 33 is formed into a tubular shape and arranged to project from the first main body 31 towards the second cassette block 5. The overlapping portion 34 is arranged to be placed adjacent to a later-described overlapping portion 54 of the second cassette block 5 in an overlapping manner. The first cassette block 3 corresponds to "a first block" described in the attached claims.

The first main body 31 is provided with a plurality of component receiving portions 35 and a plurality of guide rail engagement portions 36 arranged to engage with later-described guide rails of the housing. The component receiving portions 35 are arranged to receive the electric components such as a relay, fusible link and a fuse (these electric components correspond to "the electric components mounted to the first block" described in the claims). The plurality of component receiving to portions 35 is shaped concave in the Z direction with respect to an upper face of the first cassette block 3. Furthermore, the component receiving portions 35 are arranged to receive terminal clamps of the first electric wires from a lower side of the main body portion 31 while receiving ends of the electric components from an upper side of the main body portion 31.

The guide rail engagement portions 36 are arranged to project from an outer surface of a side wall 31A of the main body portion 31 of the first cassette block 3. The side wall 31A is arranged to be placed adjacent to a later-described peripheral wall (not shown) of the housing. Furthermore, the respective guide rail engagement portions 36 extend along the Z direction and are formed into an L-like shape.

The guide rail engagement portions 36 as well as later-described guide rail engagement portions 56 of the second cassette block 5 are arranged to engage with the guide rails of the housing, respectively. By engaging the guide rail engagement portions 35, 56 with the guide rails, respectively, the first and the second cassette blocks 3, 5 are guided along the Z direction to be received inside the housing.

Figure 2:
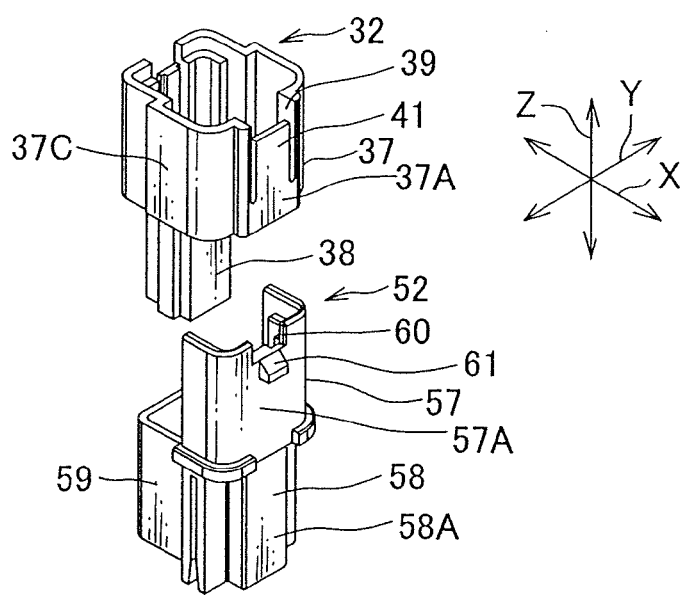
FIG. 2 is an illustration showing a first receiving portion provided at the first cassette block shown in FIG. 1 and a second receiving portion provided at the second cassette block.
Figure 3:
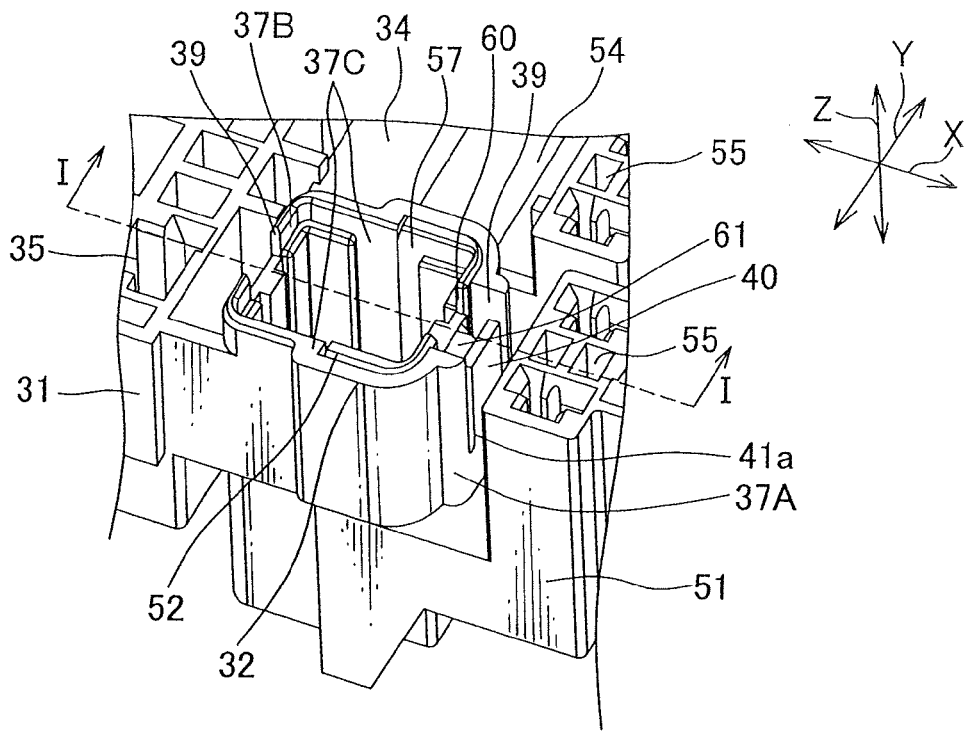
FIG. 3 is a perspective view showing the first receiving portion and the second receiving portion of FIG. 2 attached to each other.

Furthermore, as shown in FIGS. 2 and 3, the first receiving portions 32, 33 are slidably inserted into the second receiving portions 52, 53, respectively, thereby attaching the first receiving portions 32, 33 and the second receiving portions 52, 53 with respect to each other. Thus, the receiving portions 32 and 52 as well as the receiving portions 33 and 53 together form a tube, thereby providing a component receiving portion 75 for receiving the fuse 8 described above. The component receiving portion 75 is arranged to receive a terminal clamp attached to an end of the respective first and the second electric wires inserted from the lower side of the receiving portion 32, 33, 52, 53. Also, the component receiving portion 75 is arranged to receive an end of the fuse 8 from the upper side of the receiving portion 32, 33, 52, 53.

As shown in FIGS. 1 and 2, the first receiving portions 32, 33 are provided respectively at both ends of the first main body 31 along the Y direction at one end of the first main body 31 along the X direction (i.e. the one end being adjacent to the second cassette block 5). Furthermore, among the pair of first receiving portions 32, 33, one receiving portion 33 is arranged to project in the Y direction with respect to the first main body 31. Furthermore, each of the first receiving portions is 32, 33 is provided with a first tubular portion 37 and a second tubular portion 38 extending downwardly from the first tubular portion 37. The first receiving portion 32, 33 corresponds to "a first member" described in the claims.

Figure 5:
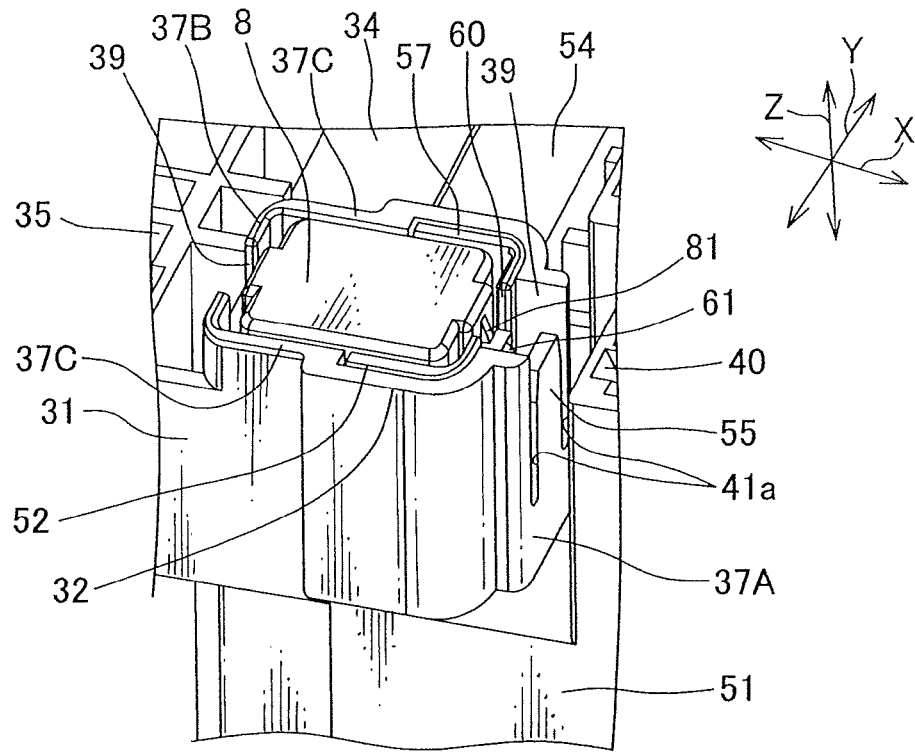
FIG. 5 is a perspective view showing a fuse received inside the first receiving portion and the second receiving portion attached to each other as shown in FIG. 3.
Figure 6:
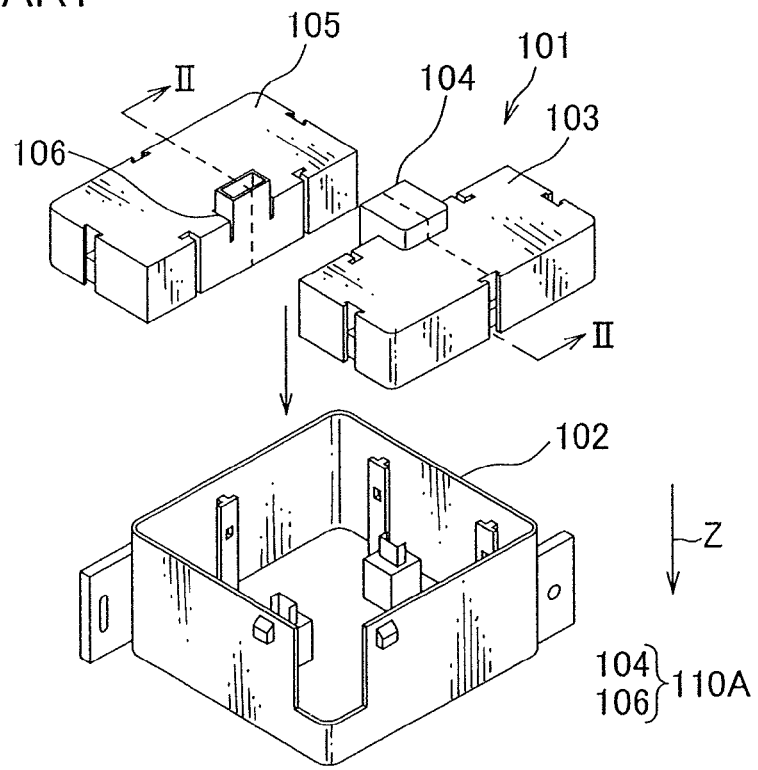
FIG. 6 is a perspective view of a conventional electrical connection box.
Figure 7:
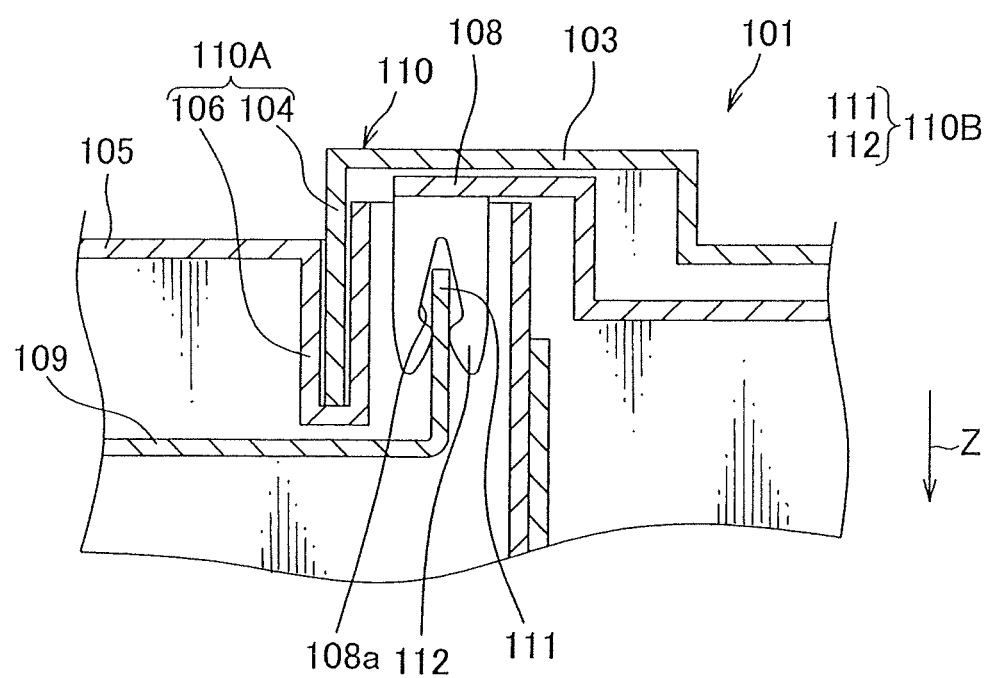
FIG. 7 is a cross-sectional view taken along a line II-II indicated in FIG. 6.

As shown in FIG. 2, the first tubular portion 37 is formed into a rectangular-tube-like shape by a plurality of peripheral walls 37A, 37B, 37C. Among the plurality of peripheral walls 37A, 37B, 37C, the peripheral walls 37A and 37B facing each other each has an insertion portion 39 arranged to receive a projection 81 projecting from respective opposing surfaces of the fuse 8, as shown in FIG. 5. The respective insertion portions 39 are formed by cutting out an upper edge of the respective peripheral walls 37A and 37B in a rectangular manner.

Figure 4:
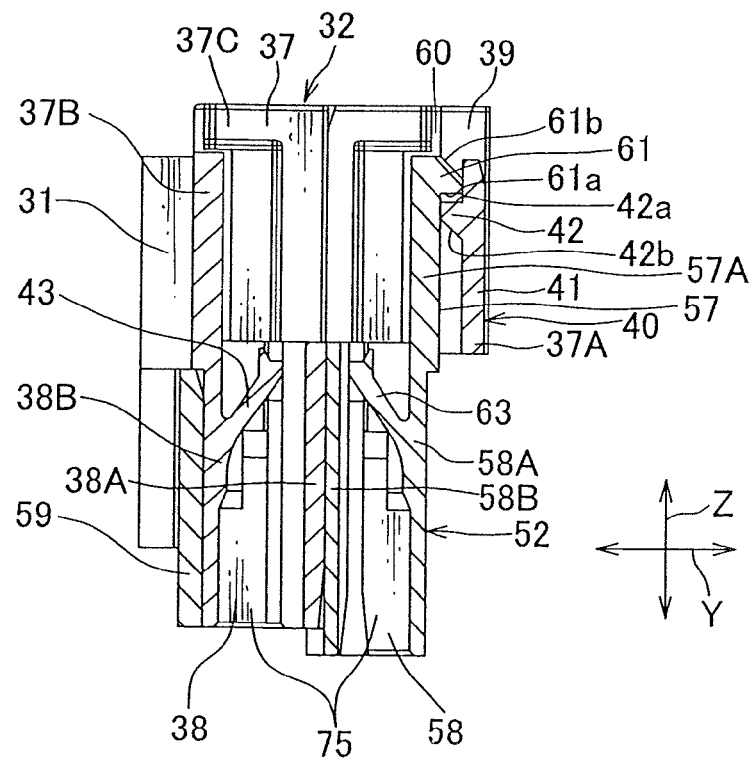
FIG. 4 is a cross-sectional view taken along a line I-I indicated in FIG. 3.

Furthermore, as shown in FIG. 4, among the peripheral walls 37A and 37B facing each other, the peripheral wall 37A located distant from the first man body 31 is provided with an engagement arm 40. This engagement arm 40 includes an arm portion 41 which is elastically deformable in the X direction with respect to the peripheral wall 37A and a first engagement portion 42 projecting from an inner surface of the arm portion 41. The arm portion 41 is located between a pair of slits 41a extending linearly in the Z direction from a lower end of the insertion portion 39. The first engagement portion 42 is arranged at an upper end of the arm portion 41 and is provided with a face 42a arranged perpendicular to the inner surface of the arm portion 41 and a tapered portion 42b. This tapered portion 42b is arranged to incline with respect to the inner surface of the arm portion 41 so as to get closer to the inner surface of the arm portion 41 as it gets away from the face 42a.

Referring again to FIG. 2, the second tubular portion 38 is formed into a tube having a diameter smaller than the first tubular portion 37 so that the first electric wire to be connected to the fuse 8 is inserted into the second tubular portion 38. Furthermore, the second tubular portion 38 is arranged so as to be inserted within a later-described surrounding portion 59 provided at the respective second is receiving portions 52, 53. Furthermore, as shown in FIG. 4, the second tubular portion 38 includes a peripheral wall 38B continuous with the peripheral wall 37B of the first tubular portion 37. The peripheral wall 38B includes an engagement bar 43.

The engagement bar 43 is formed into a stick-like shape and is arranged so as to elastically deform in the X direction. The engagement bar 43 prevents the terminal clamp of the first electric wire, which is inserted into the second tubular portion 38 from the lower side of the receiving portion 32, 33, 52, 53, from being pulled out (or detached) from the second tubular portion 38. Furthermore, one end of the engagement bar 43 is continuous with an inner surface of the peripheral wall 38B of the second tubular portion 38, while the other end of the engagement bar 43 is arranged as a free end extending upwardly towards a peripheral wall 38A located opposite to the peripheral wall 38B.

The second cassette block 5 is made of synthetic resin and is integrally formed with a block-shaped second main body 51, the pair of second receiving portions 52, 53 provided to the second main body 51 and the overlapping portion 54 arranged between the pair of second receiving portions 52, 53. The second receiving portions 52, 53 are arranged to be attached to the first receiving portions 32, 33, respectively. The second cassette block 5 corresponds to "a second block" described in the attached claims.

Referring again to FIGS. 1 and 2, the second main body 51 is provided with a plurality of component receiving portions 55 and a plurality of guide rail engagement portions 56 arranged to engage with the guide rails of the housing. The component receiving portions 55 are arranged to receive the plurality of electric components such as a relay, fusible link and a fuse (these electric components correspond to "the electric components mounted to the second block" described in the claims). The plurality of component receiving portions 55 is shaped concave in the Z direction with respect to an upper face of the second cassette block 5. Furthermore, the respective component receiving portions 55 are arranged to receive a terminal clamp of the second electric wire from a lower side of the main body portion 51 while receiving an end of the electric component from an upper side of the main body portion 51.

The guide rail engagement portions 56 are arranged to project from an outer surface of a side wall 51A of the main body portion 51 of the second cassette block 5. The side wall 51A is arranged to be placed adjacent to the peripheral wall (not shown) of the housing in an overlapping manner. Furthermore, the respective guide rail engagement portions 56 extend along the Z direction and are formed into an L-like shape.

As shown in FIGS. 1 and 2, the respective second receiving portions 52, 53 include a third tubular portion 58 into which the second electric wire to be connected to the fuse 8 is inserted, the surrounding portion 59 and a groove-like wall portion 57 extending perpendicularly from an upper edge of the third tubular portion 58. The wall portion 57 is arranged so as to be placed adjacent to an inner surface of the first tubular portion 37. Furthermore, the surrounding portion 59 is arranged so that the second tubular portion 38 of the first cassette block 3 is inserted between the surrounding portion 59 and the third tubular portion 58. The second receiving portion 52, 53 corresponds to "a second member" described in the claims.

As described above, the second electric wire to be connected to the fuse 8 is inserted into the third tubular portion 58. Furthermore, as shown in FIG. 4, an engagement bar 63 is provided to an inner surface of a peripheral wall 58A of the third tubular portion 58 distant from the surrounding portion 59.

The above-described engagement bar 63 is formed into a stick-like shape and is arranged so as to elastically deform in the X direction. This engagement bar 63 prevents the terminal clamp of the second electric wire, which is inserted into the third tubular portion 58 from the lower side of the receiving portion 32, 33, 52, 53, from being pulled out or detached from the third tubular portion 58. Furthermore, one end of the engagement bar 63 is continuous with the inner surface of the peripheral wall 58A of the third tubular portion 58, while the other end of the engagement bar 63 is arranged as a free end extending upwardly towards a peripheral wall 58B located opposite to the peripheral wall 58A.

Referring again to FIG. 2, the wall portion 57 is formed into a groove-like shape and is provided with a peripheral wall 57A arranged to be placed adjacent to the peripheral wall 37A of the first tubular portion 37 in an overlapping manner. This peripheral wall 57A includes a second engagement portion 61 and an insertion portion 60 arranged to overlap with the insertion portion 39 of the peripheral wall 37A of the first tubular portion 37. The second engagement portion 61 is arranged to engage with the engagement arm 40.

The insertion portion 60 is formed (cut-out) into a shape similar to that of the insertion portion 39 of the first receiving portion 32, 33 such that when the first receiving portion 32, 33 and the second receiving portion 52, 53 are attached to each other, edges of the insertion portions 39 and 60 are overlapped with respect to each other.

The second engagement portion 61 is arranged to project from an outer surface of the peripheral wall 57A. Furthermore, the second engagement portion 61 includes a face 61a arranged perpendicular to the outer surface of the peripheral wall 57A and a tapered portion 61b. This tapered portion 61b is arranged to incline so as to get closer to the outer surface of the peripheral wall 57 as it gets away from the face 61a.

The housing (not shown) includes a case body, an upper cover for covering an upper face of the case body and a lower cover for covering a lower face of the case body.

The case body includes a plurality of peripheral walls forming a frame and a plurality of guide rails projecting from an inner surface of the respective peripherals walls. The plurality of peripheral walls and the plurality of guide rails are made of synthetic resin and are formed integrally with each other.

The following will describe the assembling procedure of the electrical connection box 1. First, the case body is provided with the lower cover covering the lower face of the case body. The plurality of electric components is mounted to the plurality of component receiving portions 35 of the first cassette block 3, respectively. Then, the first electric wires are attached to the plurality of electric components mounted to the component receiving portions 35, respectively. Next, the plurality of electric components is mounted to the plurality of component receiving portions 55 of the second cassette block 5, followed by attaching the second electric wires to the electric components mounted to the component receiving portions 55, respectively. Alternatively, the electric components may be mounted to the respective cassette blocks 3, 5 simultaneously at the separate sites or facilities.

Next, the first cassette block 3 mounted with the plurality of electric components and the second cassette block 5 mounted with the plurality of electric components are moved towards each other such that the second tubular portions 38 of the first receiving portions 32, 33 are slidably inserted into the surrounding portions 59 of the second receiving portions 52, 53, respectively. Then, the first engagement portion 42 of the first tubular portion 37 of the first receiving portion 32, 33 abuts on the second engagement portion 61 of the wall portion 57 of the second receiving portion 52, 53. Thus, as the first cassette block 3 and the second cassette block 5 are moved further towards each other, the tapered portion 42b of the first tubular portion 37 and the tapered portion 61b of the wall portion 57 slide with respect to each other, causing the arm portion 41 of the first tubular portion 37 to elastically deform in a direction away from the second engagement portion 61 of the wall portion 57. Finally, the first engagement portion 42 of the first tubular portion 37 is moved over the second engagement portion 61 of the wall portion 57, and the arm portion 41 restores to its original state before being deformed. In such a manner, the face 42a of the first tubular portion 37 and the face 61a of the wall portion 57 are placed at the position corresponding to each other, thereby engaging the arm portion 41 with the second engagement portion 61. In this state, edges of the insertion portion 39 of the first receiving portion 32, 33 and the insertion portion 60 of the second receiving portion 52, 53 overlap with respect to each other. Consequently, the first receiving portions 32, 33 and the second receiving portions 52, 53 are attached to each other, so the first cassette block 3 and the second cassette block 5 are coupled to each other.

Next, when the first and the second cassette blocks 3, 5 coupled to each other, then the fuse 8 is received into each of the component receiving portions 75 from the upper side of the receiving portions 32, 52, 33, 53 (i.e. the component receiving portions 75) by inserting the pair of projections 81 of the fuse 8 into the respective insertion portions 39, 60 overlapped to each other. In this state where the respective fuse 8 is received inside the component receiving portion 75, the terminal clamps of the respective first and the second electric wires are inserted into the respective tubular portions 38, 58 from the lower side of the component receiving portions 75 along the Z direction. Then, each of the terminal clamps abuts to on the engagement bar 43, 63. By inserting the terminal clamp further into the tubular portion 38, 58, then the terminal clamp pushes the engagement bar 43, 63, thereby elastically deforming or bending the engagement bar 43, 63 towards the peripheral wall 38B, 58A. By inserting the terminal clamp further into the tubular portion 38, 58, then the terminal clamp is moved over the engagement bar 43, 63, and the engagement bar 43, 63 restores its original state before being deformed. Therefore, the engagement bar 43, 63 prevents the terminal clamp attached to the end of the electric wire from being pulled out or detached from the tubular portion 38, 58. By inserting the terminal clamp further into the tubular portion 38, 58, the terminal clamp is connected to an end of the fuse 8. By doing so, the plurality of first electric wires which are wired at the first cassette block 3 and connected to the electric components mounted to the first cassette block 3 and the plurality of second electric wires which are wired at the second cassette block 5 and connected to the electric components mounted to the second cassette block 5 are electrically connected to each other via the fuse 8. Thus, the respective electric wires wired at the respective cassette blocks 3, 5 are electrically connected to each other via the respective fuses 8.

Next, the first and the second cassette blocks 3, 5 are moved towards the case body having the lower cover. Then, the guide rails of the case body of the housing and the guide rail engagement portions 36, 56 of the first and the second main bodies 31, 51 are engaged with each other. Thus, the first and the second cassette blocks 3, 5 are guided along the Z direction and are received inside the case body of the housing (with the lower cover). Finally, the upper cover is attached to the case body so as to cover the upper face of the case body to complete the housing, thereby completing the assembling of the electrical connection box 1.

According to the embodiment of the present invention described above, there is provided the electrical connection box 1 having the plurality of electric components, the first cassette block 3 (the first block) mounted with the electric components and the second cassette block 5 (the second block) coupled to the first cassette block 3 and mounted with the electric components. The electrical connection box further includes the tubular-shaped first receiving portion 32, 33 (the first member) provided to the first cassette block 3 and projecting towards the is second cassette block 5, and the second receiving portion 52, 53 (the second member) provided to the second cassette block 5 and arranged to be slidably inserted into the first receiving portion 32, 33. The first cassette block 3 and the second cassette block 5 are coupled to each other by slidably inserting the second receiving portion 52, 53 into the first receiving portion 32, 33. Furthermore, at least one electric component of the plurality of electric components is received inside the first receiving portion 32, 33 and the second receiving portion 52, 53 attached to each other.

Moreover, the first electric wires (the first connection member) which are wired at the first cassette block 3 and connected to the electrical components mounted to the first cassette block 3 and the second electric wires (the second connection member) which are wired at the second cassette block 5 and connected to the electrical components mounted to the second cassette block 5 are electrically connected to each other via the fuse 8 received inside the first receiving portion 32, 33 and the second receiving portion 52, 53 attached to each other. Consequently, the first and the second electric wires can be connected to each other without requiring the electrical connection structure 110B provided in the conventional electrical connection box, thereby downsizing the electrical connection box.

Moreover, the first receiving portion 32, 33 is provided with the arm portion 41 and the first engagement portion 42 projecting from the arm portion 41 towards the second receiving portion 52, 53, the arm portion 41 being arranged between the pair of slits 41a formed at the first receiving portion 32, 33 along the insertion direction of the second receiving portion 52, 53. Also, the second receiving portion 52, 53 is provided with the second engagement portion 61 arranged to engage with the first engagement portion 42. Consequently, the first and the second cassette blocks 3, 5 can be firmly engaged with each other without being separated from each other due to the vibratory movement of the moving vehicle. Thus, the reliability of the mechanical connection between the first and the second cassette blocks 3, 5 can be improved.

In the embodiment described above, the electric wire is used as the connection member (i.e. the first connection member or the second connection member), the present invention is not limited to this, and a bus bar made of a conductive metal plate may be used as the connection member.

The embodiments described herein are only representative embodiments and are not intended to limit the present invention. It will be understood that various modifications to the embodiments may be made without departing the scope of the present invention.

What is claimed is:

1. An electrical connection box having a plurality of electric components, a first block mounted with electric components and a common electric component and a second block mounted with different electric components and the common electric component, the second block being coupled to the first block, the electrical connection box comprising,
   a tubular-shaped first member provided to the first block and projecting towards the second block, and
   a second member provided to the second block and arranged to be slidably inserted into the first member, wherein
   the first block and the second block are coupled to each other by slidably inserting the second member into the first member, and wherein
   the common electric component of the plurality of electric components is received inside the first member and the second member attached to each other.

2. The electrical connection box according to claim 1, wherein
   a first connection member connected to electrical components mounted to the first block and a second connection member connected to the electrical components mounted to the second block are electrically connected to each other via the at least one electric component received inside the first member and the second member attached to each other.

3. The electrical connection box according to claim 1, wherein
   the first member is provided with an arm portion and a first engagement portion projecting from the arm portion towards the second member,
   the arm portion being arranged between a pair of slits formed at the first member along a direction of insertion of the second member, and
   the second member is provided with a second engagement portion arranged to engage with the first engagement portion of the first member.

4. The electrical connection box according to claim 2, wherein
   the first member is provided with an arm portion and a first engagement portion projecting from the arm portion towards the second member,
   the arm portion being arranged between a pair of slits formed at the first member along a direction of insertion of the second member, and
   the second member is provided with a second engagement portion arranged to engage with the first engagement portion of the first member.

5. The electrical connection box according to claim 1, wherein
   the tubular-shaped first member is provided at a corner of the first block, and
   the second member is provided at a corner of the second block.

6. The electrical connection box according to claim 1, wherein
   the tubular-shaped first member is formed by a continuous series of peripheral walls.

\* \* \* \* \*